United States Patent
Khlat

(10) Patent No.: US 12,068,719 B2
(45) Date of Patent: Aug. 20, 2024

(54) POWER MANAGEMENT CIRCUIT OPERABLE WITH GROUP DELAY

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 397 days.

(21) Appl. No.: 17/507,173

(22) Filed: Oct. 21, 2021

(65) Prior Publication Data

US 2022/0360229 A1 Nov. 10, 2022

Related U.S. Application Data

(60) Provisional application No. 63/185,966, filed on May 7, 2021.

(51) Int. Cl.
  *H03F 1/02* (2006.01)
  *H03F 1/32* (2006.01)
  *H03F 3/21* (2006.01)

(52) U.S. Cl.
  CPC ......... *H03F 1/0238* (2013.01); *H03F 1/0227* (2013.01); *H03F 1/3241* (2013.01); *H03F 3/21* (2013.01)

(58) Field of Classification Search
  CPC .... H03F 1/0238; H03F 1/0227; H03F 1/3241; H03F 3/21; H03F 2200/102; H03F 2200/451; H03F 3/19; H03F 3/245; Y02D 30/70
  USPC ................................................. 330/297, 136
  See application file for complete search history.

(56) References Cited

U.S. PATENT DOCUMENTS

| | | | |
|---|---|---|---|
| 8,154,341 B2 * | 4/2012 | Ishikawa | H03F 1/0227 |
| | | | 330/297 |
| 11,349,436 B2 | 5/2022 | Khlat | |
| 2012/0163632 A1 | 6/2012 | Lesso et al. | |
| 2012/0170770 A1 | 7/2012 | Lesso et al. | |
| 2018/0241347 A1 | 8/2018 | Petrovic et al. | |
| 2018/0331659 A1 | 11/2018 | Khesbak et al. | |

(Continued)

OTHER PUBLICATIONS

Notice of Allowance for U.S. Appl. No. 17/523,957, mailed Jan. 13, 2023, 9 pages.

(Continued)

*Primary Examiner* — Andrea Lindgren Baltzell
*Assistant Examiner* — Khiem D Nguyen
(74) *Attorney, Agent, or Firm* — Withrow & Terranova, P.L.L.C.

(57) ABSTRACT

A power management circuit operable with group delay is provided. The power management circuit includes a transceiver circuit configured to generate a digital target voltage and digitally delay the digital target voltage to generate multiple delayed digital target voltages. Accordingly, the transceiver circuit can generate a windowed digital target voltage in multiple delay tolerance windows based on the delayed digital target voltages. Since the windowed digital target voltage can tolerate a certain amount of group delay in each of the group delay tolerance windows, an envelope tracking (ET) voltage generated based on an analog version of the windowed digital target voltage can therefore tolerate the group delay in each of the group delay tolerance windows as well. As a result, it is possible to avoid distortion in the ET voltage to help improve performance of the power management circuit.

20 Claims, 6 Drawing Sheets

(56) References Cited

U.S. PATENT DOCUMENTS

2020/0304082 A1   9/2020   Henzler et al.
2021/0194517 A1   6/2021   Mirea et al.

OTHER PUBLICATIONS

U.S. Appl. No. 17/523,999, filed Nov. 11, 2021.
U.S. Appl. No. 17/523,985, filed Nov. 11, 2021.
U.S. Appl. No. 17/523,966, filed Nov. 11, 2021.
U.S. Appl. No. 17/523,957, filed Nov. 11, 2021.
Non-Final Office Action for U.S. Appl. No. 17/523,985, mailed Apr. 25, 2024, 8 pages.
Non-Final Office Action for U.S. Appl. No. 17/523,966, mailed Jun. 11, 2024, 6 pages.

\* cited by examiner

POWER MANAGEMENT CIRCUIT OPERABLE WITH GROUP DELAY

RELATED APPLICATIONS

This application claims the benefit of U.S. provisional patent application Ser. No. 63/185,966 filed on May 7, 2021, the disclosure of which is hereby incorporated herein by reference in its entirety.

FIELD OF THE DISCLOSURE

The technology of the disclosure relates generally to a power management circuit, and particularly an envelope tracking (ET) power management circuit.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal(s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device employs a power amplifier(s) to amplify the RF signal(s) before transmitting in the mmWave RF spectrum.

Envelope tracking (ET) is a power management technique designed to improve operating efficiency of the power amplifier(s). Specifically, the power amplifier(s) is configured to amplify the RF signal(s) based on a time-variant ET voltage that closely tracks a time-variant power envelope of the RF signal(s). The time-variant voltage is typically generated by an ET integrated circuit (ETIC) in the wireless communication device. Notably, the inherent processing delay associated with the ETIC can inadvertently cause the time-variant ET voltage to lag the time-variant power envelope of the RF signal(s). As a result, the peaks of the time-variant ET voltage may become misaligned with the peaks of the time-variant power envelope, which may cause the power amplifier(s) to clip and distort the RF signal(s). In this regard, it is desirable to ensure that the ETIC can maintain good alignment between the time-variant ET voltage and the time-variant power envelope of the RF signal(s).

SUMMARY

Aspects disclosed in the detailed description include a power management circuit operable with group delay. The power management circuit includes a transceiver circuit configured to generate a digital target voltage and digitally delay the digital target voltage to generate multiple delayed digital target voltages. Accordingly, the transceiver circuit can generate a windowed digital target voltage in multiple delay tolerance windows based on the delayed digital target voltages. Since the windowed digital target voltage can tolerate a certain amount of group delay in each of the group delay tolerance windows, an envelope tracking (ET) voltage generated based on an analog version of the windowed digital target voltage can therefore tolerate the group delay in each of the group delay tolerance windows as well. As a result, it is possible to avoid distortion in the ET voltage to help improve performance of the power management circuit.

In one aspect, a power management circuit is provided. The power management circuit includes a transceiver circuit. The transceiver circuit includes a target voltage generation circuit. The target voltage generation circuit is configured to generate a digital target voltage based on a digital signal. The transceiver circuit also includes multiple voltage delay circuits. Each of the voltage delay circuits is configured to digitally delay the digital target voltage by a respective one of multiple delay factors to generate a respective one of multiple delayed digital target voltages. The transceiver circuit also includes a control circuit. The control circuit is configured to generate a windowed digital target voltage in multiple delay tolerance windows based on the delayed digital target voltages. Each of the delay tolerance windows is defined by a smallest one of the delay factors and a largest one of the delay factors.

In another aspect, a transceiver circuit is provided. The transceiver circuit includes a target voltage generation circuit. The target voltage generation circuit is configured to generate a digital target voltage based on a digital signal. The transceiver circuit also includes multiple voltage delay circuits. Each of the voltage delay circuits is configured to digitally delay the digital target voltage by a respective one of multiple delay factors to generate a respective one of multiple delayed digital target voltages. The transceiver circuit also includes a control circuit. The control circuit is configured to generate a windowed digital target voltage in multiple delay tolerance windows based on the delayed digital target voltages. Each of the delay tolerance windows is defined by a smallest one of the delay factors and a largest one of the delay factors.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1A:
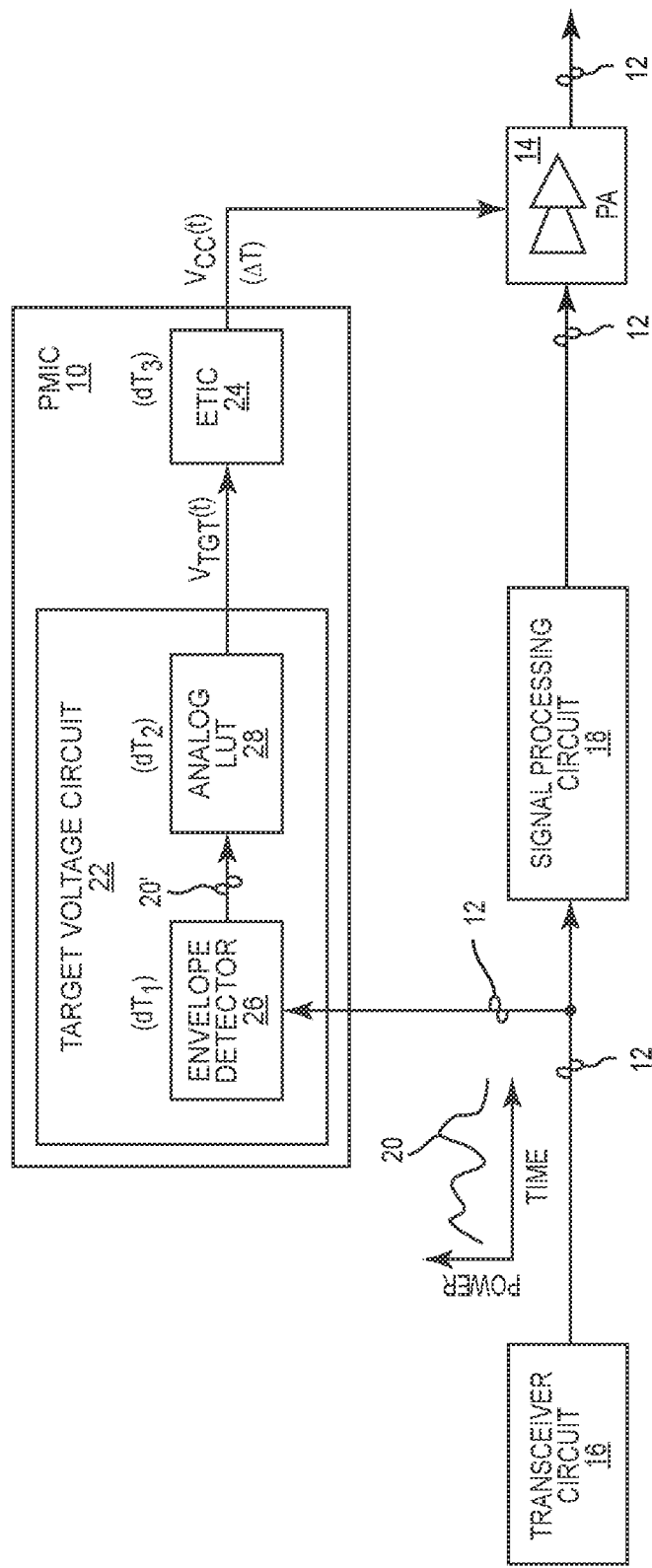
FIG. 1A is a schematic diagram of an exemplary existing power management circuit that that may cause amplitude distortion in an analog signal as a result of a group delay associated with a time-variant voltage generated by the existing power management circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a power management circuit operable with group delay. The power management circuit includes a transceiver circuit configured to generate a digital target voltage and digitally delay the digital target voltage to generate multiple delayed digital target voltages. Accordingly, the transceiver circuit can generate a windowed digital target voltage in multiple delay tolerance windows based on the delayed digital target voltages. Since the windowed digital target voltage can tolerate a certain amount of group delay in each of the group delay tolerance windows, an envelope tracking (ET) voltage generated based on an analog version of the windowed digital target voltage can therefore tolerate the group delay in each of the group delay tolerance windows as well. As a result, it is possible to avoid distortion in the ET voltage to help improve performance of the power management circuit.

Figure 1B:
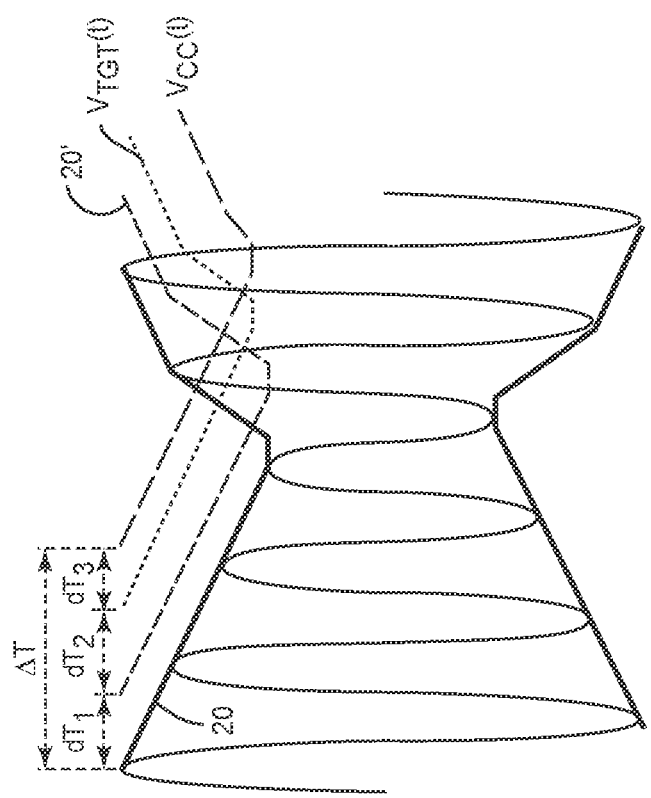
FIG. 1B is a graphic diagram providing an exemplary illustration of the group delay between a time-variant envelope of the analog signal and the time-variant voltage in FIG. 1A.
Figure 1C:
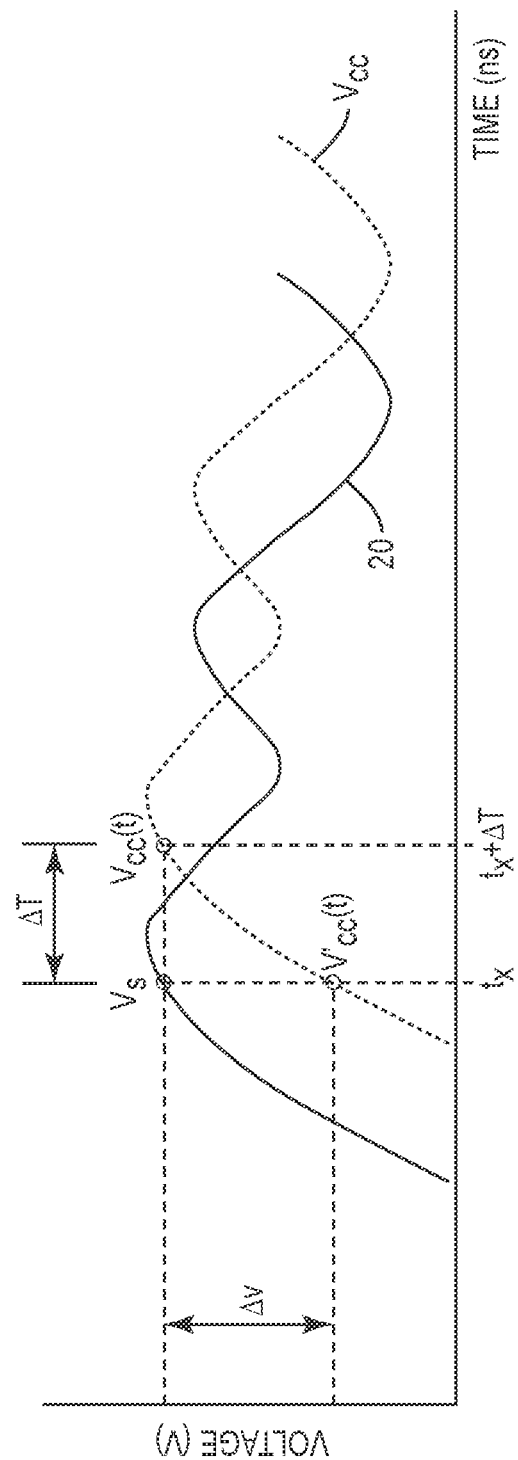
FIG. 1C is a graphic diagram providing an exemplary illustration as to how the group delay can cause amplitude distortion in the analog signal in FIG. 1A.
Figure 2:
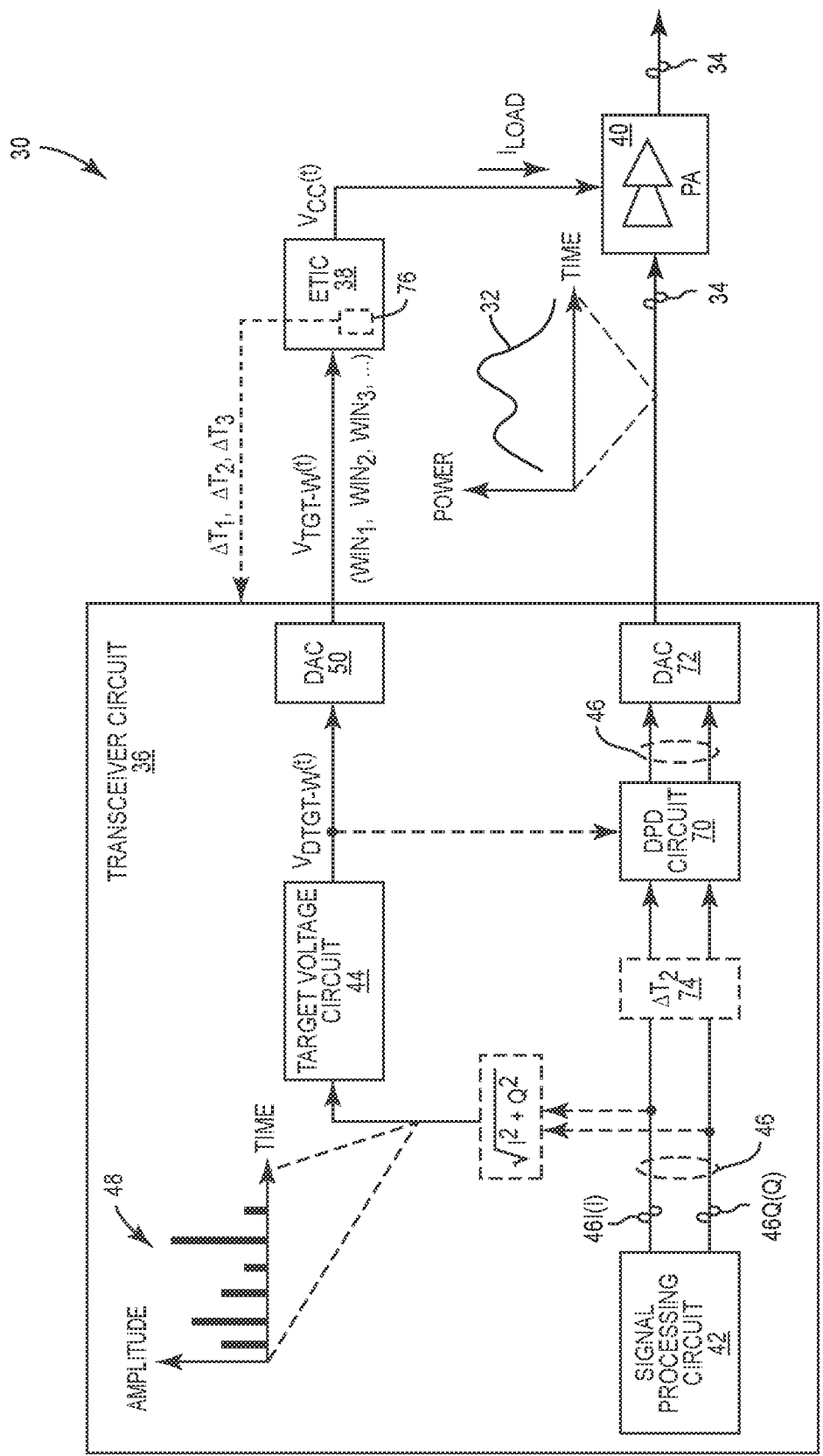
FIG. 2 is a schematic diagram of an exemplary power management circuit configured according to embodiments of the present disclosure to tolerate a group delay between a time-variant voltage and a time-variant envelope of an analog signal.

Before discussing a power management circuit employing a transceiver circuit of the present disclosure, starting at FIG. 2, a brief overview of an existing power management circuit that may cause amplitude distortion in an analog signal due to a group delay associated with an ET voltage is first provided with reference to FIGS. 1A-1C.

FIG. 1A is a schematic diagram of an exemplary existing power management circuit 10 that may cause amplitude distortion in an analog signal 12 as a result of a group delay $\Delta T$ associated with an ET voltage $V_{CC}(t)$ generated by the existing power management circuit 10. The existing power management circuit 10 is configured to provide the ET voltage $V_{CC}(t)$ to a power amplifier 14 for amplifying the analog signal 12. The analog signal 12 may be generated by a transceiver circuit 16 and provided to a signal processing circuit 18 in an intermediate frequency (IF). The signal processing circuit 18 may upconvert the analog signal 12 from the IF to a carrier frequency and provide the analog signal 12 to the power amplifier 14 for amplification.

The analog signal 12 is associated with a time-variant envelope 20 that rises and falls over time. Thus, to prevent potential amplitude distortion in the analog signal 12 and ensure a higher operating efficiency of the power amplifier 14, it is necessary for the existing power management circuit 10 to generate the ET voltage $V_{CC}(t)$ to closely track the time-variant envelope 20.

In other words, the ET voltage $V_{CC}(t)$ needs to be time-aligned with the time-variant envelope 20 at the power amplifier 14. As such, the existing power management circuit 10 is configured to include a target voltage circuit 22 and an ET integrated circuit (ETIC) 24. The target voltage circuit 22 includes an envelope detector circuit 26 and an analog lookup table (LUT) circuit 28. The envelope detector circuit 26 is configured to detect the time-variant envelope 20 of the analog signal 12 and provide a detected time-variant envelope 20' to the analog LUT circuit 28. The analog LUT circuit 28 is configured to generate a time-variant target voltage $V_{TGT}(t)$ from the detected time-variant envelope 20' and provide the time-variant target voltage $V_{TGT}(t)$ to the ETIC 24. The ETIC 24, in turn, generates the ET voltage $V_{CC}(t)$ based on the time-variant target voltage $V_{TGT}(t)$. In this regard, since the time-variant target voltage $V_{TGT}(t)$ tracks the detected time-variant envelope 20' and the ET voltage $V_{CC}(t)$ tracks the time-variant target voltage $V_{TGT}(t)$, the ET voltage $V_{CC}(t)$ should end up rising and falling along with the time-variant envelope 20.

However, the envelope detector circuit 26, the analog LUT circuit 28, and the ETIC 24 can cause inherent group delays $dT_1$, $dT_2$, and $dT_3$, respectively. As a result, as shown in FIG. 1B, the detected time-variant envelope 20' can lag behind the time-variant envelope 20 associated with the analog signal 12 by the group delay $dT_1$, the time-variant target voltage $V_{TGT}(t)$ can lag behind the detected time-variant envelope 20' by the group delay $dT_2$, and the ET voltage $V_{CC}(t)$ can lag behind the time-variant target voltage $V_{TGT}(t)$ by the group delay $dT_3$. As a result of the inherent group delays $dT_1$, $dT_2$, and $dT_3$, the ET voltage $V_{CC}(t)$ may be delayed from the time-variant envelope 20 by the group delay $\Delta T$.

FIG. 1B is a graphic diagram providing an exemplary illustration of the group delay $\Delta T$ between the time-variant envelope 20 of the analog signal 12 and the ET voltage $V_{CC}(t)$ in FIG. 1A. Common elements between FIGS. 1A and 1B are shown therein with common element numbers and will not be re-described herein.

As shown in FIG. 1B, the detected time-variant envelope 20' is delayed from the time-variant envelope 20 of the analog signal 12 by the group delay $dT_1$, the time-variant target voltage $V_{TGT}(t)$ is delayed from the detected time-variant envelope 20' by the group delay $dT_2$, and the ET voltage $V_{CC}(t)$ is delayed from the time-variant target voltage $V_{TGT}(t)$ by the group delay $dT_3$. The group delay $\Delta T$, which refers generally to an actual transit time of a signal (e.g., the ET voltage $V_{CC}(t)$) through a device (e.g., the existing power management circuit 10) under test as a function of frequency, can thus include at least the group delay $dT_1$, the group delay $dT_2$, and the group delay $dT_3$. Understandably, the group delay $\Delta T$ can cause timing misalignment between the ET voltage $V_{CC}(t)$ and the time-variant envelope 20 at the power amplifier 14, thus causing amplitude distortion (a.k.a., amplitude clipping) in the analog signal 12.

As illustrated in FIG. 1C, the misalignment between the ET voltage $V_{CC}(t)$ and the time-variant envelope 20 of the analog signal 12 can cause amplitude distortion in the analog signal 12. FIG. 1C is a graphic diagram providing an exemplary illustration as to how the group delay $\Delta T$ can cause amplitude distortion in the analog signal 12 in FIG. 1A.

If the time-variant envelope 20 and ET voltage $V_{CC}(t)$ are perfectly aligned, an instantaneous amplitude of the analog signal 12 (not shown), which is represented by a voltage $V_S$, would substantially equal the ET voltage $V_{CC}(t)$ at time $t_x$. However, as shown in FIG. 1C, the ET voltage $V_{CC}(t)$ lags behind the time-variant envelope 20 by the group delay $\Delta T$. As such, at time $t_x$, the power amplifier 14 (not shown) receives a lower voltage $V'_{CC}(t)$, instead of the ET voltage $V_{CC}(t)$. In this regard, the ET voltage $V_{CC}(t)$ deviates from the time-variant envelope 20 by a voltage differential $\Delta v$ at time $t_x$. Consequently, the power amplifier 14 may clip the analog signal 12 to cause the amplitude distortion. As such, it is desirable to adapt the existing power management circuit 10 to tolerate the group delay $\Delta T$ between the ET voltage $V_{CC}(t)$ and the time-variant envelope 20 of the analog signal 12.

In this regard, FIG. 2 is a schematic diagram of an exemplary power management circuit 30 configured according to embodiments of the present disclosure to tolerate a group delay between an ET voltage $V_{CC}(t)$ and a time-variant power envelope 32 of an RF signal 34. The power management circuit 30 includes a transceiver circuit 36, an ETIC 38, and a power amplifier circuit 40. In a non-limiting example, the transceiver circuit 36 is configured to generate the RF signal 34 associated with the time-variant power envelope 32, the ETIC 38 is configured to generate the ET voltage $V_{CC}(t)$, and the power amplifier circuit 40 is configured to amplify the RF signal 34 based on the ET voltage $V_{CC}(t)$.

According to embodiments disclosed herein, the transceiver circuit 36 is configured to generate a windowed target voltage $V_{TGT-W}(t)$ and the ETIC 38 is configured to generate the ET voltage $V_{CC}(t)$ based on the windowed target voltage $V_{TGT-W}(t)$. As discussed in detail below, the transceiver circuit 36 is configured to generate the windowed target voltage $V_{TGT-W}(t)$ in a number of delay tolerance windows $WIN_1$, $WIN_2$, $WIN_3$, and so on (hereinafter referred to as "delay tolerance windows WINs" for brevity), and the windowed target voltage $V_{TGT-W}(t)$ is so generated to tolerate a certain amount of group delay in each of the group delay tolerance windows WINs. Thus, by generating the ET voltage $V_{CC}(t)$ based on the windowed target voltage $V_{TGT-W}(t)$, the ET voltage $V_{CC}(t)$ can become more tolerable to the group delay in each of the group delay tolerance windows WINs. As a result, it is possible to avoid or reduce distortion in the ET voltage $V_{CC}(t)$ to thereby improve performance of the power amplifier circuit 40.

In an embodiment, the transceiver circuit 36 includes a signal processing circuit 42 and a target voltage circuit 44. In a non-limiting example, the signal processing circuit 42 can generate a digital in-phase signal 46I and a digital quadrature signal 46Q, which are collectively referred to as a digital signal 46 hereinafter. The digital in-phase signal 46I is associated with a time-variant in-phase amplitude I and the digital quadrature signal 46Q is associated with a time-variant quadrature amplitude Q. Thus, the time-variant in-phase amplitude I and the time-variant quadrature amplitude Q can collectively define a time-variant signal amplitude 48 of the digital signal 46, which can be expressed as $\sqrt{I^2+Q^2}$. Accordingly, the target voltage circuit 44 can be configured to generate a windowed digital target voltage $V_{DTGT-W}(t)$ based on the time-variant signal amplitude 48.

The transceiver circuit 36 also includes a voltage digital-to-analog converter (DAC) 50. The voltage DAC 50 is configured to convert the windowed digital target voltage $V_{DTGT-W}(t)$ into the windowed target voltage $V_{TGT-W}(t)$. In other words, the windowed target voltage $V_{TGT-W}(t)$ is an analog version of the windowed digital target voltage $V_{DTGT-W}(t)$.

Figure 3:
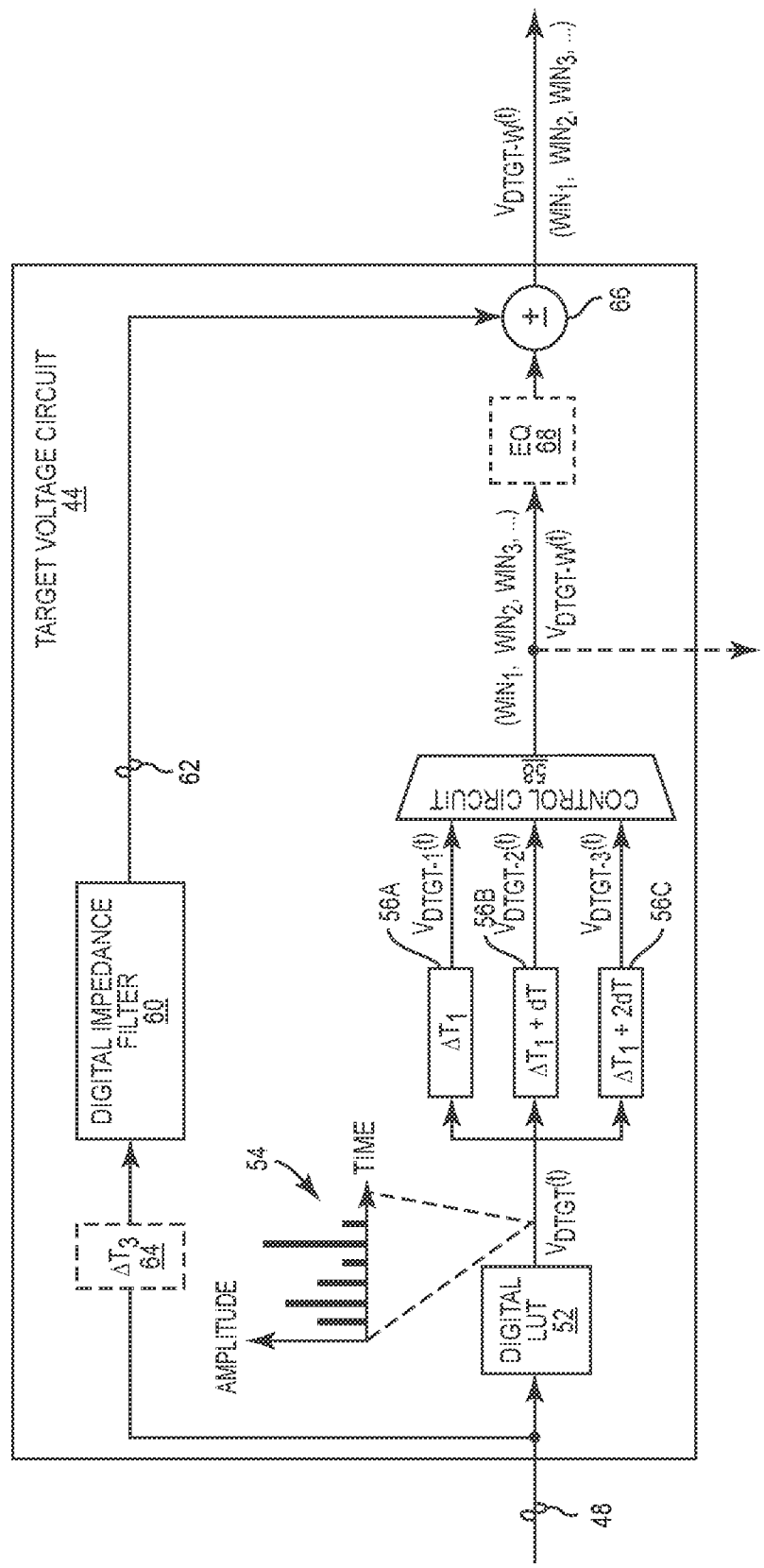
FIG. 3 is a schematic diagram providing an exemplary illustration of a target voltage circuit, which can be provided in a transceiver circuit in the power management circuit of FIG. 2 to generate a windowed digital target voltage in multiple delay tolerance windows.

FIG. 3 is a schematic diagram providing an exemplary illustration of the target voltage circuit 44 configured to generate the windowed digital target voltage $V_{DTGT-W}(t)$ in the delay tolerance windows WINs. Common elements between FIGS. 2 and 3 are shown therein with common element numbers and will not be re-described herein.

In an embodiment, the target voltage circuit 44 includes a target voltage generation circuit 52 (denoted as "digital LUT"). In a non-limiting example, the target voltage generation circuit 52 can employ a digital LUT that linearly or nonlinearly correlates the time-variant signal amplitude 48 with a time-variant voltage amplitude 54. In this regard, the time-variant voltage amplitude 54 is a function of the time-variant signal amplitude 48. Accordingly, the target voltage generation circuit 52 can generate a digital target voltage $V_{DTGT}(t)$ associated with the time-variant voltage amplitude 54 based on the time-variant signal amplitude 48 of the digital signal 46.

The target voltage circuit 44 also includes multiple voltage delay circuits 56A, 56B, and 56C. In an embodiment, each of the voltage delay circuits 56A, 56B, and 56C is configured to digitally delay the digital target voltage $V_{DTGT}(t)$ by a respective one of multiple delay factors $\Delta T_1$, $\Delta T_1+dT$, and $\Delta T_1+2dT$ to generate a respective one of multiple delayed digital target voltages $V_{DTGT-1}(t)$, $V_{DTGT-2}(t)$, and $V_{DTGT-3}(t)$. More specifically, $V_{DTGT-1}(t)=V_{DTGT}(t+\Delta T_1)$, $V_{DTGT-2}(t)=V_{DTGT}(t+\Delta T_1+dT)$, and $V_{DTGT-2}(t)=V_{DTGT}(t+\Delta T_1+2dT)$. Given that the delayed digital target voltages $V_{DTGT-1}(t)$, $V_{DTGT-2}(t)$, and $V_{DTGT-3}(t)$ are simply delayed versions of the digital target voltage $V_{DTGT}(t)$, the delayed digital target voltages $V_{DTGT-1}(t)$, $V_{DTGT-2}(t)$, and $V_{DTGT-3}(t)$ will each inherit the time-variant voltage amplitude 54 from the digital target voltage $V_{DTGT}(t)$.

In a non-limiting example, each of the delay tolerance windows WINs can be defined by a difference between a smallest one of the delay factors (e.g., $\Delta T_1$) and a largest one of the delay factors (e.g., $\Delta T_1+2dT$). Accordingly, each of the delay tolerance windows WINs can have a duration of 2dT ($\Delta T_1+2dT-\Delta T_1$). An exact duration of dT, which may be determined through measurement, can be inversely related to modulation bandwidth of the RF signal 34. In this regard, the lower the modulation bandwidth is, the longer the duration of dT can be, and vice versa.

The target voltage circuit 44 also includes a control circuit 58, which can be a field-programmable gate array (FPGA) or a programmable multiplexer, as an example. The control circuit 58 is configured to generate the windowed digital target voltage $V_{DTGT-W}(t)$ in each of the delay tolerance windows WINs based on the delayed digital target voltages $V_{DTGT-1}(t)$, $V_{DTGT-2}(t)$, and $V_{DTGT-3}(t)$.

Figure 4:
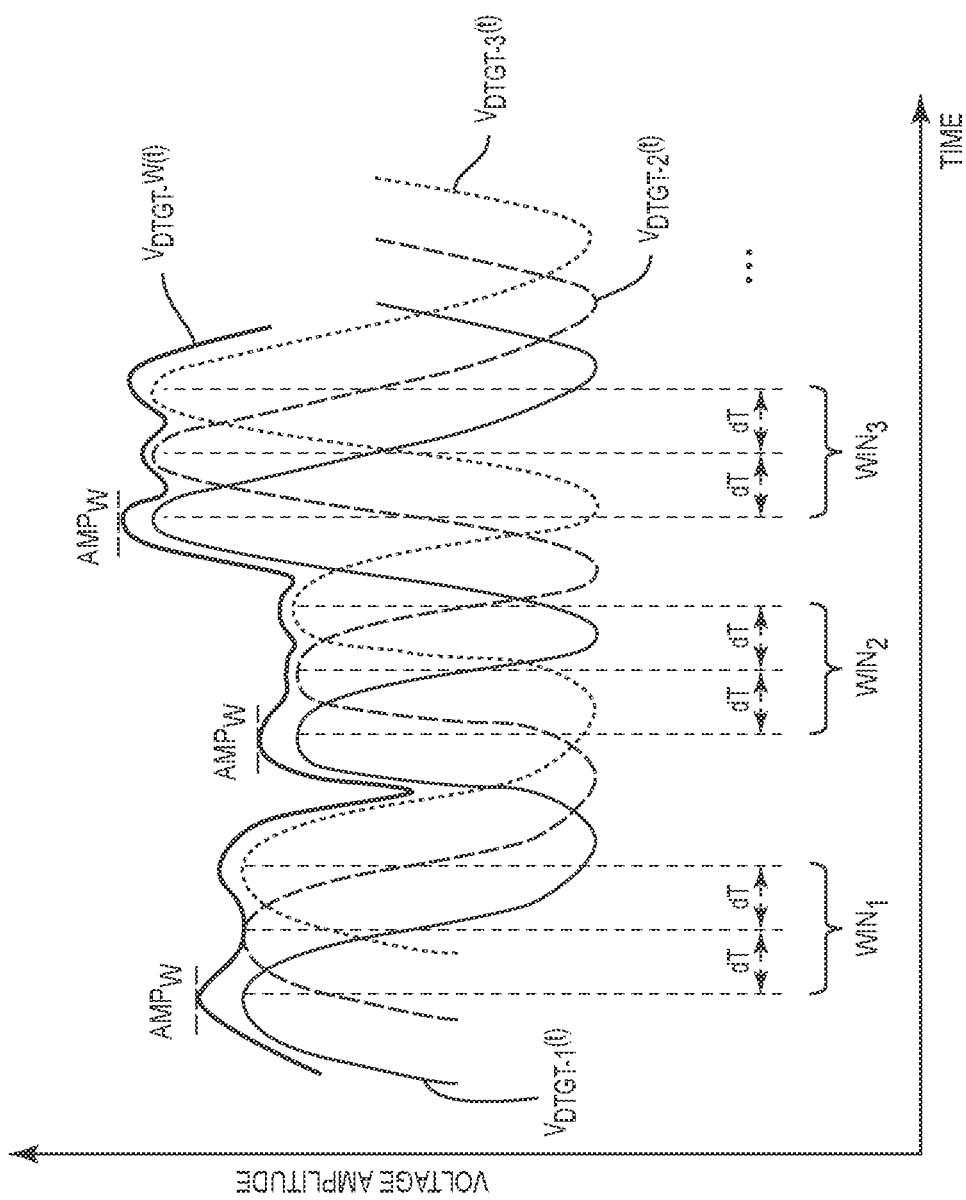
FIG. 4 is a graphic diagram providing an exemplary illustration of the windowed digital target voltage generated by the target voltage circuit in FIG. 3.

FIG. 4 is a graphic diagram providing an exemplary illustration of the windowed digital target voltage $V_{DTGT-W}(t)$ generated by the target voltage circuit 44 in FIG. 3 based on the delayed digital target voltages $V_{DTGT-1}(t)$, $V_{DTGT-2}(t)$, and $V_{DTGT-3}(t)$. Common elements between FIGS. 3 and 4 are shown therein with common element numbers and will not be re-described herein.

As shown in FIG. 4, the delayed digital target voltage $V_{DTGT-2}(t)$ is delayed from the delayed digital target voltage $V_{DTGT-1}(t)$ by dT, and the delayed digital target voltage $V_{DTGT-3}(t)$ is delayed from the delayed digital target voltage $V_{DTGT-2}(t)$ by dT. As a result, each of the delay tolerance windows WINs has the duration of 2dT. In a non-limiting example, each of the delay tolerance windows WINs can be so determined to coincide with a peak amplitude of the delayed digital target voltages $V_{DTGT-1}(t)$, $V_{DTGT-2}(t)$, and $V_{DTGT-3}(t)$.

Notably, although the delayed digital target voltages $V_{DTGT-1}(t)$, $V_{DTGT-2}(t)$, and $V_{DTGT-3}(t)$ each inherits the time-variant voltage amplitude 54 from the digital target voltage $V_{DTGT}(t)$, the instantaneous voltage amplitude of the delayed digital target voltages $V_{DTGT-1}(t)$, $V_{DTGT-2}(t)$, and $V_{DTGT-3}(t)$ are different in each of the delay tolerance windows WINs due to the different delay factors $\Delta T_1$, $\Delta T_1+dT$, and $\Delta T_1+2dT$. In this regard, in each of the delay tolerance windows WINs, the control circuit 58 outputs one of the delayed digital target voltages $V_{DTGT-1}(t)$, $V_{DTGT-2}(t)$, and $V_{DTGT-3}(t)$ corresponding to a highest one of the time-variant voltage amplitudes 54 as the windowed digital target voltage $V_{DTGT-W}(t)$. As a result, the windowed digital target voltage $V_{DTGT-W}(t)$ can be generated to have a windowed time-variant amplitude $AMP_W$ that is higher than or equal to the highest time-variant voltage amplitude 54 among the delayed digital target voltages $V_{DTGT-1}(t)$, $V_{DTGT-2}(t)$, and $V_{DTGT-3}(t)$ in each of the delay tolerance windows WINs. Understandably, the windowed time-variant amplitude $AMP_W$ as generated by the control circuit 58 will no longer be linearly correlated with the time-variant voltage amplitude 54 in each of the delay tolerance windows WINs.

With reference to FIG. 2, since the ETIC 38 generates the ET voltage $V_{CC}(t)$ based on the windowed target voltage $V_{TGT-W}(t)$, which is converted from the windowed digital target voltage $V_{DTGT-W}(t)$, the ET voltage $V_{CC}(t)$ can become more resilient to group delay in each of the delay tolerance windows WINs. However, since the windowed time-variant amplitude $AMP_W$ is no longer linearly correlated with the time-variant voltage amplitude 54, the windowed time-variant amplitude $AMP_W$ will not be linearly related to the time-variant signal amplitude 48 at the power amplifier circuit 40. As a result, a load current $I_{LOAD}$ caused by the power amplifier circuit 40 can cause a voltage ripple in the ET voltage $V_{CC}(t)$.

With reference back to FIG. 3, the target voltage circuit 44 can include a digital impedance filter 60. The digital impedance filter 60 generates a ripple cancelation signal 62 based on the time-variant signal amplitude 48 of the digital signal 46 that is proportionally related to the load current $I_{LOAD}$. In an embodiment, the ripple cancelation signal 62 includes an opposite voltage ripple to suppress the voltage ripple induced by the power amplifier circuit 40.

The target voltage circuit 44 may also include a delay circuit 64 (denoted as "$\Delta T_3$"). The delay circuit 64 may be configured to delay the time-variant signal amplitude 48 by a delay factor $\Delta T_3$ to thereby time-align the opposite voltage ripple created by the digital impedance filter 60 and the voltage ripple caused by the load current $I_{LOAD}$ at the power amplifier circuit 40.

The target voltage circuit 44 also includes a combiner circuit 66. The combiner circuit 66 is configured to combine the ripple cancelation signal 62 with the windowed digital target voltage $V_{DTGT-W}(t)$ to thereby add the opposite voltage ripple into the windowed digital target voltage $V_{DTGT-W}(t)$.

The target voltage circuit 44 may also include a voltage equalizer 68 (denoted as "EQ"). The voltage equalizer 68 can be configured to equalize the windowed digital target voltage $V_{DTGT-W}(t)$ prior to combining with the ripple cancelation signal 62. In a non-limiting example, the voltage equalizer 68 can implement a transfer function having a second-order complex-zero term to suppress disturbance in the ET voltage $V_{CC}(t)$, which can be caused by trace inductance between the ETIC 38 and the power amplifier circuit 40 in FIG. 2.

With reference back to FIG. 2, the transceiver circuit 36 also includes a digital pre-distortion (DPD) circuit 70 and a signal DAC 72. The DPD circuit 70 is configured to digitally pre-distort the digital signal 46 and the signal DAC 72 is configured to convert the pre-distorted digital signal 46 into the RF signal 34. In an embodiment, the DPD circuit 70 may pre-distort the digital signal 46 based on the windowed digital target voltage $V_{DTGT-W}(t)$.

The transceiver circuit 36 may include a signal delay circuit 74 (denoted as "$\Delta T_2$"). The signal delay circuit 74 can be configured to digitally delay the digital signal 46 by a signal delay factor $\Delta T_2$ to thereby time-align the ET voltage $V_{CC}(t)$ and the time-variant power envelope 32 of the RF signal 34 at the power amplifier circuit 40.

In one embodiment, various delay factors (e.g., $\Delta T_1$, $\Delta T_2$, $\Delta T_3$) may be determined based on lab measurement, factor test, and/or any other appropriated means. In another embodiment, it is also possible to include a delay measurement circuit 76 in the ETIC 38 to measure and feedback the various delay factors (e.g., $\Delta T_1$, $\Delta T_2$, $\Delta T_3$).

Those skilled in the art will recognize improvements and modifications to the embodiments of the present disclosure. All such improvements and modifications are considered within the scope of the concepts disclosed herein and the claims that follow.

What is claimed is:

1. A power management circuit comprising:
a transceiver circuit comprising:
a target voltage circuit comprising:
a target voltage generation circuit configured to generate a digital target voltage based on a digital signal;
a plurality of voltage delay circuits each configured to digitally delay the digital target voltage by a respective one of a plurality of delay factors to generate a respective one of a plurality of delayed digital target voltages; and
a control circuit configured to generate a windowed digital target voltage in a plurality of delay tolerance windows based on the plurality of delayed digital target voltages, wherein each of the plurality of delay tolerance windows is defined by a smallest one of the plurality of delay factors and a largest one of the plurality of delay factors.

2. The power management circuit of claim 1, wherein the transceiver circuit further comprises a signal processing circuit configured to generate the digital signal associated with a time-variant signal amplitude.

3. The power management circuit of claim 2, wherein:
the target voltage circuit is further configured to generate the digital target voltage associated with a time-variant voltage amplitude as a function of the time-variant signal amplitude;
the plurality of voltage delay circuits each further configured to generate the respective one of the plurality of delayed digital target voltages associated with the time-variant voltage amplitude; and
the control circuit is further configured to generate the windowed digital target voltage having a windowed time-variant amplitude higher than or equal to a highest one of the time-variant voltage amplitude associated with each of the plurality of delayed digital target voltages in each of the plurality of delay tolerance windows.

4. The power management circuit of claim 2, wherein the transceiver circuit further comprises:
a digital pre-distortion (DPD) circuit configured to digitally pre-distort the digital signal;
a signal digital-to-analog converter (DAC) configured to convert the pre-distorted digital signal into a radio frequency (RF) signal; and
a voltage DAC configured to convert the windowed digital target voltage into a windowed target voltage.

5. The power management circuit of claim 4, wherein the DPD circuit is further configured to digitally pre-distort the digital signal based on the windowed digital target voltage.

6. The power management circuit of claim 4, further comprising:
an envelope tracking (ET) integrated circuit (ETIC) configured to generate an ET voltage based on the windowed target voltage; and
a power amplifier circuit configured to amplify the RF signal based on the ET voltage.

7. The power management circuit of claim 6, wherein the transceiver circuit further comprises a signal delay circuit configured to digitally delay the digital signal by a signal delay factor to thereby time-align the ET voltage and the RF signal at the power amplifier circuit.

8. The power management circuit of claim 6, wherein the target voltage circuit further comprises:
a digital impedance filter configured to generate a ripple cancelation signal based on the time-variant signal amplitude of the digital signal, the ripple cancelation signal comprising an opposite voltage ripple to thereby suppress a voltage ripple induced by the power amplifier circuit; and
a combiner circuit configured to combine the ripple cancelation signal with the windowed digital target voltage to thereby add the opposite voltage ripple into the windowed digital target voltage.

9. The power management circuit of claim 8, wherein the transceiver circuit further comprises a delay circuit configured to delay the time-variant signal amplitude to thereby time-align the opposite voltage ripple and the voltage ripple at the power amplifier circuit.

10. The power management circuit of claim 8, wherein the target voltage circuit further comprises a voltage equalizer configured to equalize the windowed digital target voltage to thereby offset a distortion in the ET voltage.

11. A transceiver circuit comprising:
a target voltage circuit comprising:
a target voltage generation circuit configured to generate a digital target voltage based on a digital signal;
a plurality of voltage delay circuits each configured to digitally delay the digital target voltage by a respective one of a plurality of delay factors to generate a respective one of a plurality of delayed digital target voltages; and
a control circuit configured to generate a windowed digital target voltage in a plurality of delay tolerance windows based on the plurality of delayed digital target voltages, wherein each of the plurality of delay tolerance windows is defined by a smallest one of the plurality of delay factors and a largest one of the plurality of delay factors.

12. The transceiver circuit of claim 11, further comprising a signal processing circuit configured to generate the digital signal associated with a time-variant signal amplitude.

13. The transceiver circuit of claim 12, wherein:
the target voltage circuit is further configured to generate the digital target voltage associated with a time-variant voltage amplitude as a function of the time-variant signal amplitude;
the plurality of voltage delay circuits are each further configured to generate the respective one of the plurality of delayed digital target voltages associated with the time-variant voltage amplitude; and
the control circuit is further configured to generate the windowed digital target voltage having a windowed time-variant amplitude higher than or equal to a highest one of the time-variant voltage amplitude associated with each of the plurality of delayed digital target voltages in each of the plurality of delay tolerance windows.

14. The transceiver circuit of claim 12, further comprising:
   a digital pre-distortion (DPD) circuit configured to digitally pre-distort the digital signal;
   a signal digital-to-analog converter (DAC) configured to convert the pre-distorted digital signal into a radio frequency (RF) signal; and
   a voltage DAC configured to convert the windowed digital target voltage into a windowed target voltage.

15. The transceiver circuit of claim 14, wherein the DPD circuit is further configured to digitally pre-distort the digital signal based on the windowed digital target voltage.

16. The transceiver circuit of claim 14 coupled to an envelope tracking (ET) integrated circuit (ETIC) and a power amplifier circuit, wherein:
   the ETIC is configured to generate an ET voltage based on the windowed target voltage; and
   the power amplifier circuit is configured to amplify the RF signal based on the ET voltage.

17. The transceiver circuit of claim 16, further comprising a signal delay circuit configured to digitally delay the digital signal by a signal delay factor to thereby time-align the ET voltage and the RF signal at the power amplifier circuit.

18. The transceiver circuit of claim 16, wherein the target voltage circuit further comprises:
   a digital impedance filter configured to generate a ripple cancelation signal based on the time-variant signal amplitude of the digital signal, the ripple cancelation signal comprising an opposite voltage ripple to thereby suppress a voltage ripple induced by the power amplifier circuit; and
   a combiner circuit configured to combine the ripple cancelation signal with the windowed digital target voltage to thereby add the opposite voltage ripple into the windowed digital target voltage.

19. The transceiver circuit of claim 18, further comprising a delay circuit configured to delay the time-variant signal amplitude to thereby time-align the opposite voltage ripple and the voltage ripple at the power amplifier circuit.

20. The transceiver circuit of claim 18, wherein the target voltage circuit further comprises a voltage equalizer configured to equalize the windowed digital target voltage to thereby offset a distortion in the ET voltage.

* * * * *